(12) United States Patent
Weste

(10) Patent No.: US 7,586,193 B2
(45) Date of Patent: Sep. 8, 2009

(54) MM-WAVE ANTENNA USING CONVENTIONAL IC PACKAGING

(75) Inventor: Neil H. E. Weste, Coal Point (AU)

(73) Assignee: NHEW R&D Pty Ltd (AU)

( * ) Notice: Subject to any disclaimer, the term of this patent is extended or adjusted under 35 U.S.C. 154(b) by 83 days.

(21) Appl. No.: 11/539,112

(22) Filed: Oct. 5, 2006

(65) Prior Publication Data

US 2007/0103380 A1    May 10, 2007

Related U.S. Application Data

(60) Provisional application No. 60/724,457, filed on Oct. 7, 2005.

(51) Int. Cl.
*H01L 23/34* (2006.01)
(52) U.S. Cl. ............... 257/728; 257/E23.01; 257/678; 257/679; 257/687; 343/907; 343/700 MS; 29/600; 438/106; 438/110
(58) Field of Classification Search .......... 257/728, 257/E23.01, 693, 678, 687, 679, 684, 685; 343/907, 895, 700 MS, 872, 572.7; 29/600, 29/846, 841; 438/106, 126, 110, 117, 121
See application file for complete search history.

(56) References Cited

U.S. PATENT DOCUMENTS

| | | | | |
|---|---|---|---|---|
| 3,940,046 A | | 2/1976 | Fern ........................ | 228/8 |
| 5,296,407 A | | 3/1994 | Eguchi ..................... | 437/195 |
| 5,682,143 A | | 10/1997 | Brady et al. ............. | 340/572 |
| 5,972,156 A | | 10/1999 | Brady et al. ............. | 156/280 |
| 6,218,728 B1 | * | 4/2001 | Kimura ..................... | 257/693 |
| 6,359,596 B1 | | 3/2002 | Claiborne ................ | 343/795 |
| 6,703,935 B1 | | 3/2004 | Chung et al. ............ | 340/572.7 |

(Continued)

FOREIGN PATENT DOCUMENTS

EP    0977145 A2    2/2000

(Continued)

OTHER PUBLICATIONS

Aleksander Dec and Ken Suyama, "A 1.9-GHz CMOS VCO with Micromachined Electromechanically Tunable Capacitors," IEEE Journal of Solid-State Circuits, vol. 35, No. 8, pp. 1231-1237, Aug. 2000.

(Continued)

*Primary Examiner*—Chris C Chu
(74) *Attorney, Agent, or Firm*—Dov Rosenfeld; Inventek

(57) ABSTRACT

An integrated circuit with an antenna and a method of forming the integrated circuit. The method includes, in an integrated circuit package, forming each bond to or from an integrated circuit pad that is intended to be an antenna connection to be elongated compared to other bonds, and arranged in an approximately perpendicular direction to the plane of the integrated circuit; encapsulating the top of the integrated circuit package with a dielectric material at a height grater than a desired antenna length; and milling the dielectric encapsulation down to a pre-selected and calibrated height, such that the elongated bond wire to/from the integrated circuit pad that is intended to be an antenna connection is severed, such that the approximately vertical bond wire to/from the integrated circuit pad that is intended to be an antenna connection forms a quarter wave monopole.

8 Claims, 7 Drawing Sheets

U.S. PATENT DOCUMENTS

| | | | | |
|---|---|---|---|---|
| 6,818,985 | B1 * | 11/2004 | Coccioli et al. | 257/728 |
| 6,849,936 | B1 * | 2/2005 | Berman et al. | 257/679 |
| 7,295,161 | B2 * | 11/2007 | Gaucher et al. | 343/700 MS |
| 2004/0067603 | A1 * | 4/2004 | Hagen | 438/106 |
| 2005/0093111 | A1 | 5/2005 | Berman et al. | 257/664 |
| 2006/0028378 | A1 | 2/2006 | Gaucher et al. | 343/700 |

FOREIGN PATENT DOCUMENTS

| | | |
|---|---|---|
| EP | 1069645 A2 | 1/2001 |
| JP | 11306306 A | 11/1999 |
| WO | WO 96/13793 | 5/1996 |
| WO | WO 2006/022836 A1 | 3/2006 |

OTHER PUBLICATIONS

J. Branch, X. Guo, L. Gao, A. Sugavanam, J.-J. Lin and K.K. O, "Wireless Communication in a Flip-Chip Package Using Integrated Antennas on Silicon Substrates," IEEE Electron Device Letters, vol. 26, No. 2, pp. 115-117, Feb. 2005.

C.H. Doan, S. Emami, D.A. Sobel, A.M. Niknejad and R.W. Broderson, "Design Considerations for 60 GHz CMOS Radios," IEEE Communications Magazine, pp. 132-140, Dec. 2004.

C.H. Doan, S. Emami, D. Sobel, A.M. Niknejad and R.W. Broderson, "60 GHz CMOS Radio for Gb/s Wireless LAN," 2004 IEEE Radio Frequency Integrated Circuits Symposium, pp. 225-228, Jun. 6-8, 2004.

"hf/rf ZONE Product Review: Peregrine Semiconductor PE4263 CMOS RF Switch," analogZONE, week of Dec. 6, 2004. Downloaded Jan. 23, 2007 at http://www.analogzone.com/prod__mfr.htm.

"Peregrine Semiconductor Ramps SP6T RF Antenna Switch; PE4269 Die on UltraCMOS Technology Complements Popular PE4263 Sibling," Business Wire, San Diego, CA, Apr. 12, 2005. Downloaded Jan. 23, 2007 at http://www.findarticles.com/p/articles/mi__m0EIN/is__2005__April__12/ai__n13599620.

"UltraCMOS Process Technology," Peregrine Semiconductor Corp., San Diego, CA, 2005. Downloaded Sep. 27, 2005 from http://www.peregrine-semi.com/.

Chris M. Meuth, "Packaging Choices for Wireless IC Designs," TechOnline, Nov. 22, 2002. Downloaded on Jan. 23, 2007 at: http://www.commsdesign.com/article/printableArticle.jhtml;jsessionid=RTC0L02EEHI0UQSNDLPSKHOCJUNN2JVN?articleID=192200431.

Ron Wilson, "Silicon Germanium Process Heralds Fast RF," Electronic Engineering Times-Asia, Sep. 16, 2005. Downloaded Jan. 23, 2007 at: http://www.eetasia.com/ARTP__8800376815__590626.HTM.

PCT Search report on corresponding PCT Application No. PCT/US2006/39528.

* cited by examiner

MM-WAVE ANTENNA USING CONVENTIONAL IC PACKAGING

RELATED APPLICATION(S)

The present invention claims priority of and is a conversion of U.S. Provisional Patent Application No. 60/724,457 filed Oct. 7, 2005 to inventor Weste titled "MM-WAVE ANTENNA USING CONVENTIONAL IC PACKAGING." The contents of such provisional patent application are incorporated herein by reference.

BACKGROUND

The present disclosure relates to an antenna, and a method of constructing an antenna for an integrated circuit, in particular, for a mm-wave integrated circuit (IC).

Mm-wave systems are becoming more and more important. For example, communication systems that operate in the tens to hundreds of GHz range are becoming important. Furthermore, TeraHertz imaging applications are emerging as important in Homeland Security applications, mainly because TeraHertz radiation can image through clothing. As explained below, the antenna leads for an IC that operates in this frequency range has traditionally been a problem. There is a need in the art for an IC packaging method that includes an antenna, and that is relatively inexpensive.

FIG. 1 illustrates a typical package used for microwave RF ICs. The RF chip (RF-IC) 121 is bonded to an insulating package substrate 103. Bond wires 112 are attached from the chip pads (IC pads) 123 to package bond pads 111 that are on the top of the package substrate 103. The package bond pads 111 connect through the package substrate 103 to package pins 105 on the bottom of the package substrate. The package pins 105 are soldered to board traces 107 on a printed circuit board 101 that form connections to voltage supplies, antennas and/or other signal interconnects. The RF-IC is encapsulated by an encapsulation 115.

Antennas for microwave frequencies are relatively large, and do not fit on-chip. Therefore they typically are built or mounted on the printed circuit board, and are connected to the packaged chip by board traces.

When designing a complete RF system using a chip, there are a variety of unwanted parasitic passive capacitances and inductances that must be accounted for. FIG. 2 shows a reasonable approximation for an equivalent circuit of a conventional RF IC lead for a signal passing from the chip to the package, especially an antenna connection. The drawing shows some of these capacitances and inductances. These capacitances and inductances include the IC pin capacitance to ground (around 1 pF), the bond wire inductance (around 1 nH), the package capacitance (around 10 pF), the package inductance (around 1-5 nH), the board inductance and the board capacitance, both of which have values that are a function of the trace length(s). Note that the traces may be in the form of transmission lines. Up to a given frequency, depending on the exact values of the parasitic capacitances and inductances, all of these capacitances and inductances need to be taken into account when connecting say an on-chip power amplifier to a board mounted antenna. For typical present-day packages, frequencies up to of the order of 5 GHz are possible using conventional packaging techniques.

At mm-wave frequencies, the antennas are smaller and it is possible to place them on-chip. However, to date, due to the small vertical dimensions of the typical fabrication processes used, the bandwidths achievable for these antennas are very narrow. While smaller than microwave antennas, they still consume significant chip area. For instance at 60 GHz, a quarter wave length on chip is around 400 um.

It is desired to produce an RF-IC at mm waves, e.g., at around 60 GHz. At such mm-wave frequencies, the circuit shown in FIG. 2 acts as a lossy low-pass filter. Such conventional packaging techniques as shown in FIG. 1 thus cannot be used due to the high loss engendered by the parasitic capacitances and inductances. Expensive or hand crafted solutions must be used to achieve the off and on chip connections at mm-wave frequencies. This results in very expensive mm-wave systems. Such costs prevent such systems from being widely deployed. The high cost is due to the low level of integration and hence the cost of the relatively large number of inter-module connections required. For example, a typical receiver would require a separate antenna to LNA (low noise amplifier) connection, a LNA to mixer connection, and a local oscillator to mixer connection.

Complete "systems on a chip" are becoming possible on silicon at mm-wave frequencies. With a system-on-a-chip, the only off-chip connection at the high frequency remains the antenna or antennas.

Flip-Chip bonds are known in the art, and such bonds provide for direct connection from the substrate of the chip to another substrate, e.g., via solder bumps. Thus, one option for connecting antennas to an RF chip is to "flip-chip" bond a silicon substrate of a mm-wave RF IC onto a low-loss substrate that may hold antennas. Direct connection from chip to substrate can yield low inductance connections. The problem with such an approach is the increased manufacturing cost associated with the flip-chip process, and the associated low yield of the manufacturing process.

Thus there is a need in the art for a relatively low-cost method to connect one or more antennas to an RF IC at mm-wave frequencies. Such a relatively low-cost method should use conventional packaging techniques.

SUMMARY

Described herein is an integrated circuit with an antenna and a method of forming the integrated circuit. One embodiment of the method includes, in an integrated circuit package, forming each bond to or from an integrated circuit pad that is intended to be an antenna connection to be elongated compared to other bonds, and arranged in an approximately perpendicular direction to the plane of the integrated circuit; encapsulating the top of the integrated circuit package with a dielectric material at a height grater than a desired antenna length; and milling the dielectric encapsulation down to a pre-selected and calibrated height, such that the elongated bond wire to/from the integrated circuit pad that is intended to be an antenna connection is severed, such that the approximately vertical bond wire to/from the integrated circuit pad that is intended to be an antenna connection forms a quarter wave monopole.

DESCRIPTION OF EXAMPLE EMBODIMENTS

One embodiment of the invention is called a "PacAnt" for Package Antenna, and is a mm-wave antenna built using a modified but otherwise normal bonding process. Another embodiment is an array of mm-wave antennas built using a modified but otherwise normal bonding process. Another embodiment is a method of building one or more mm-wave antennas using a modified but otherwise normal bonding process.

Figure 7:
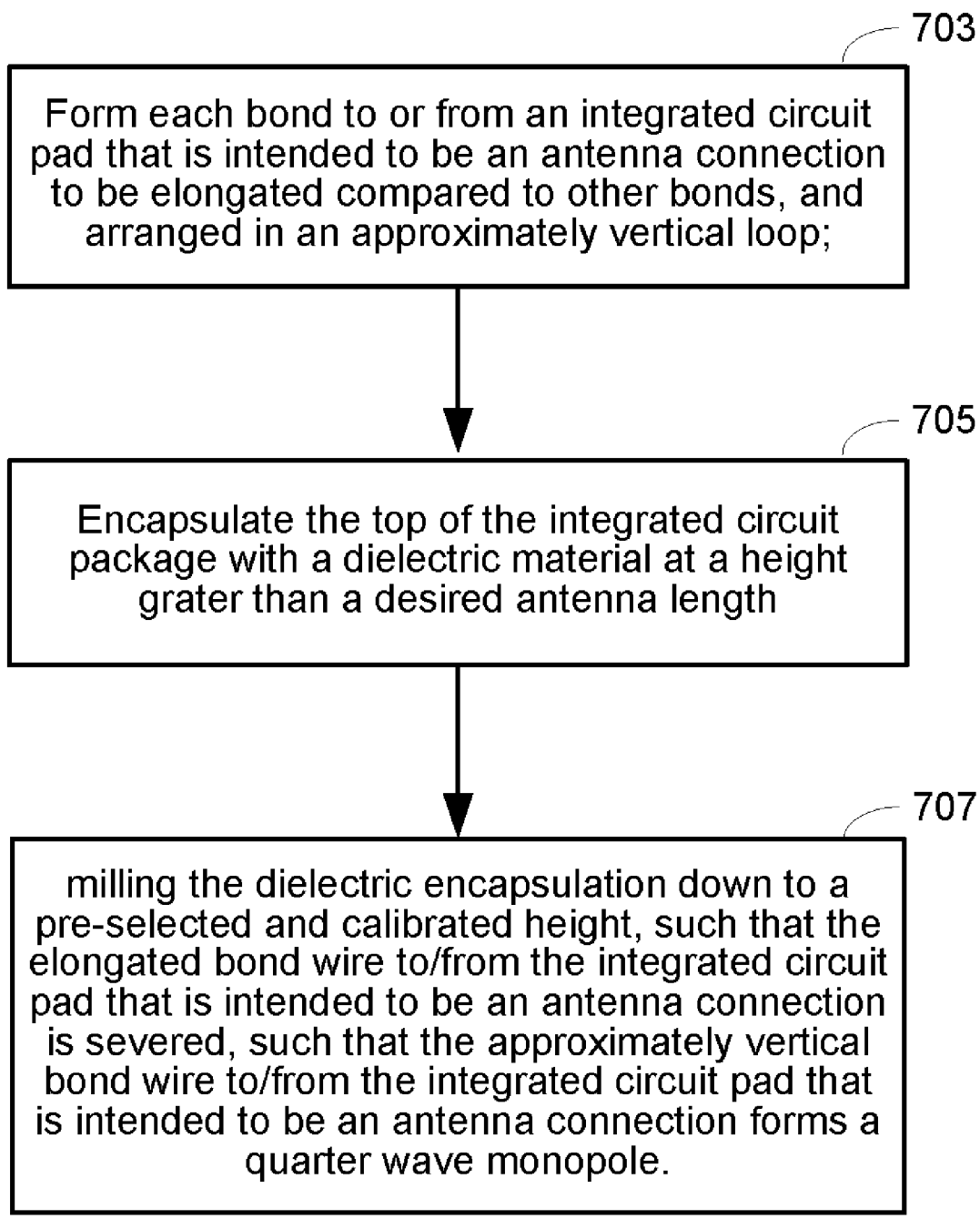
FIG. 7 shows a flowchart of a method of forming an antenna on an RF-IC.

FIG. 7 shows one embodiment of a method of forming an antenna in an RF-IC.

In 703, the method includes forming a bond to or from each integrated circuit pad that is invented to be an antenna. Each such bond is formed to be elongated compared to other bonds, and to be in an approximately vertical loop, that is, a loop that is approximately perpendicular to the plane of the integrated circuit.

Figure 3:
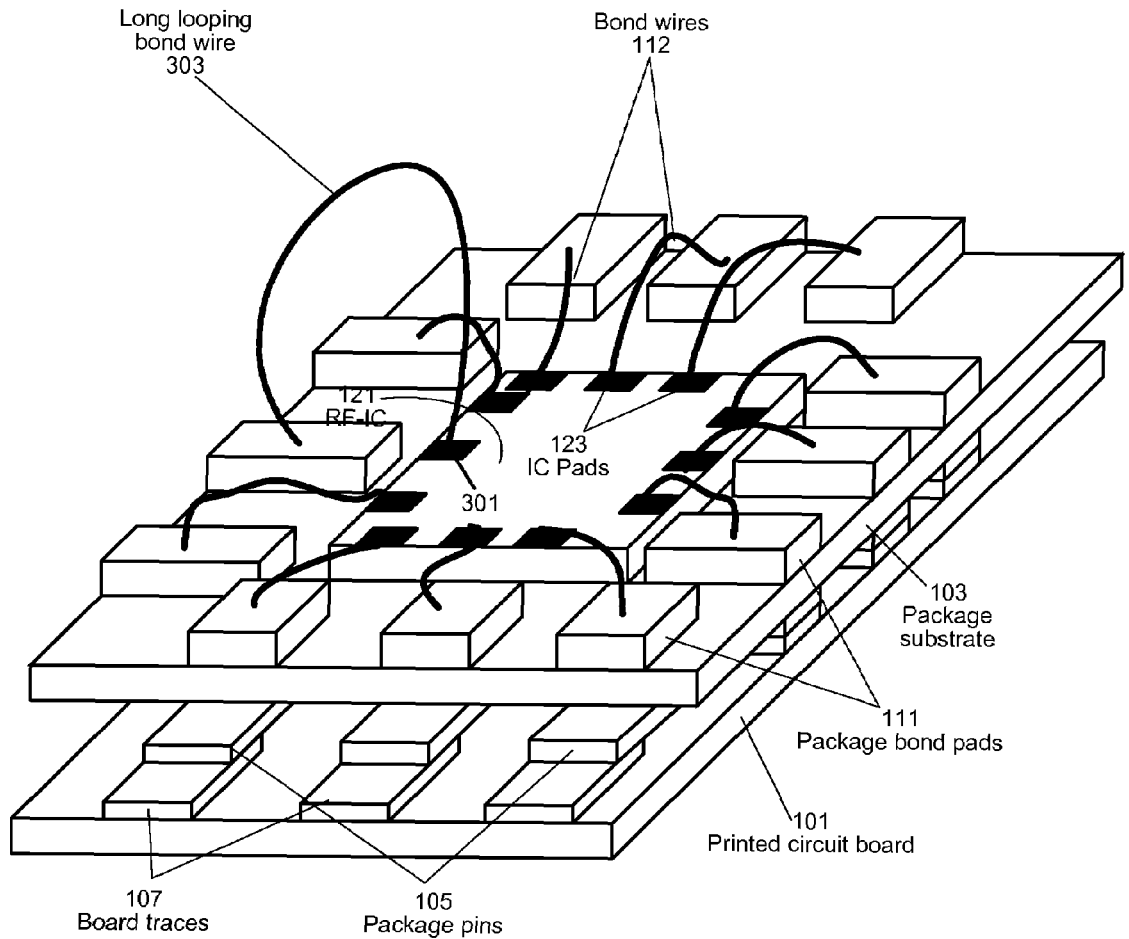
FIG. 3 shows the first step of a packaging process for mm-wave antenna connections according to an embodiment of the invention.

FIG. 3 illustrates what the first step 703 of the packaging process for mm-wave antenna connections, what I call "Phase 1". In Phase 1, as shown in FIG. 3, each bond that is intended to be an antenna connection is deliberately looped approximately vertically. The bond from IC pad 301 is such a bond, and an approximately vertical loop 303 is formed for this bond to/from IC pad 301. Normally, bonds wires such as 112 are kept short to minimize inductance. The length of the vertical loops such as loop 303 is designed to be more than a quarter wavelength.

Figure 4:
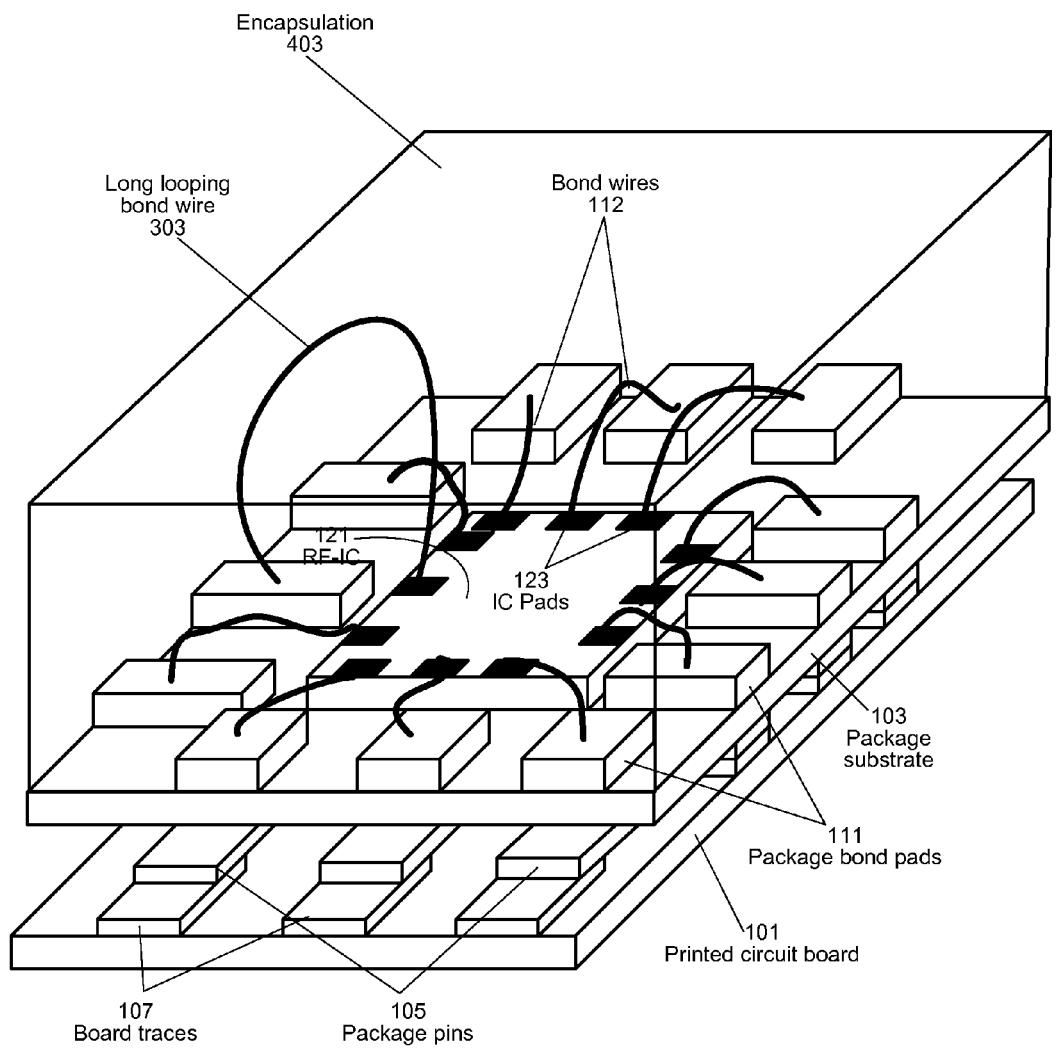
FIG. 4 shows the second step of a packaging process for mm-wave antenna connections according to an embodiment of the invention.

Referring again to FIG. 7, the method includes in 705, encapsulating the top of the integrated circuit package with a dielectric material at a height grater than a desired antenna length. I call this second step "Phase 2" of the packaging process for mm-wave antenna connections. This is illustrated in FIG. 4. In this second phase, the normal package dielectric encapsulation 403 is applied to the top of the package but at an increased height to account for and cover the elongated antenna bond wire.

Figure 5:
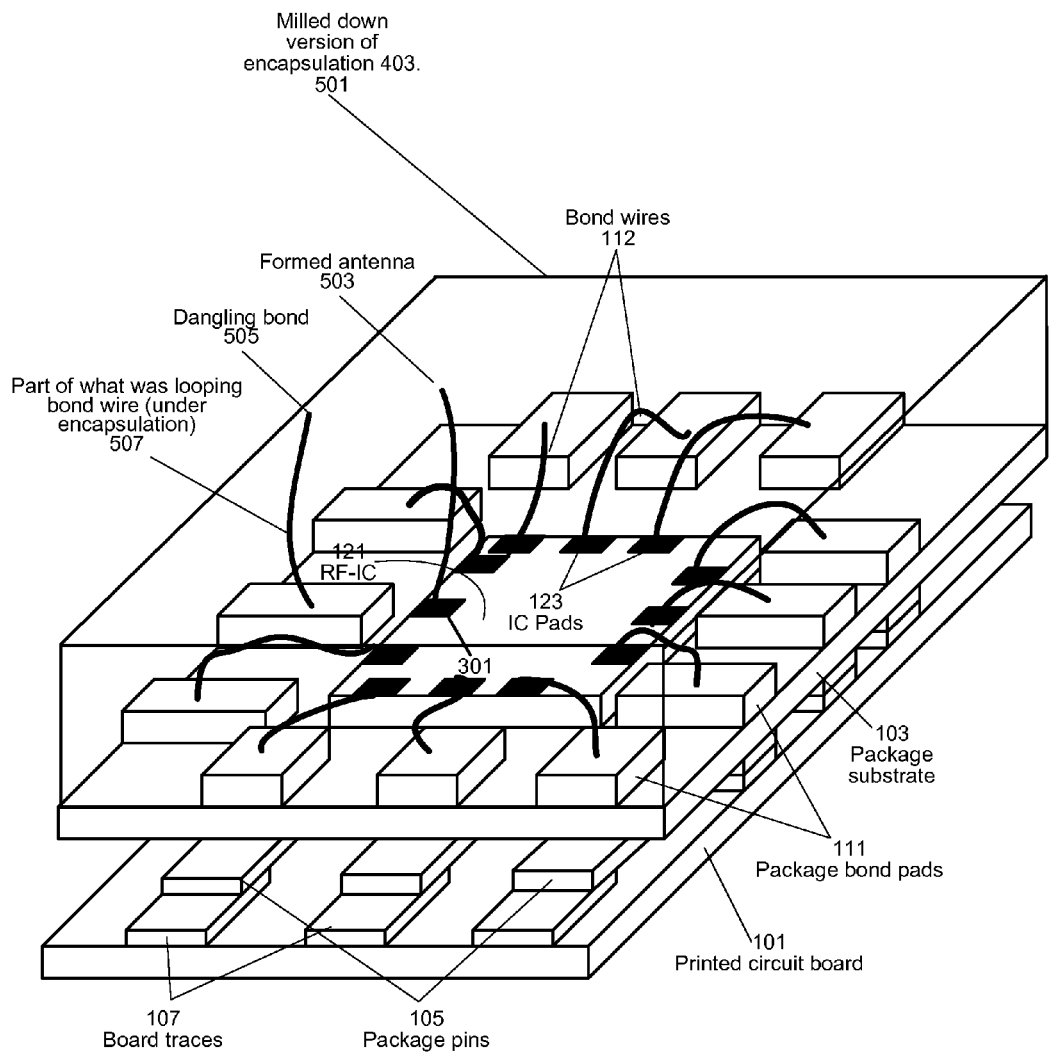
FIG. 5 shows the result of the third step of a packaging process for mm-wave antenna connections according to an embodiment of the invention.

Referring again to FIG. 7, the method includes in 707, milling the dielectric encapsulation 403 down to a pre-selected and calibrated height, such that the elongated bond wire 303 to/from the integrated circuit pad 301 that is intended to be an antenna connection is severed, such that the approximately vertical bond wire to/from the integrated circuit pad 301 that is intended to be an antenna connection forms a quarter wave monopole. This is illustrated in FIG. 5 that shows the results of step 707 that I call "Phase 3" of the packaging process for mm-wave antenna connections. In this phase, the dielectric encapsulation of the package 403 is milled down to a calibrated height for the milled encapsulation 501. In the process of milling, the elongated bond wire 303 is severed, leaving two connections. One, the "dangling" connection 505 connects to a package pin. The other 503 connects to the IC pad 301 and forms an antenna. The other end of this connection 503 is an open circuit. For an appropriate (and calculatable) thickness of dielectric, a quarter wave monopole 503 is constructed from the bond wire to the IC bond pad. The ground plane and any necessary counterpoise may be composed of on-chip connections and bond wires to the package.

As a refinement, the length of the antenna connection—in one embodiment, the approximately vertical bond wire—can be adjusted by a laser etching process. In yet another refinement, the laser etching process is combined with on-chip real time monitoring to produce a mm-wave RF chip that includes a self test mechanism.

Figure 1:
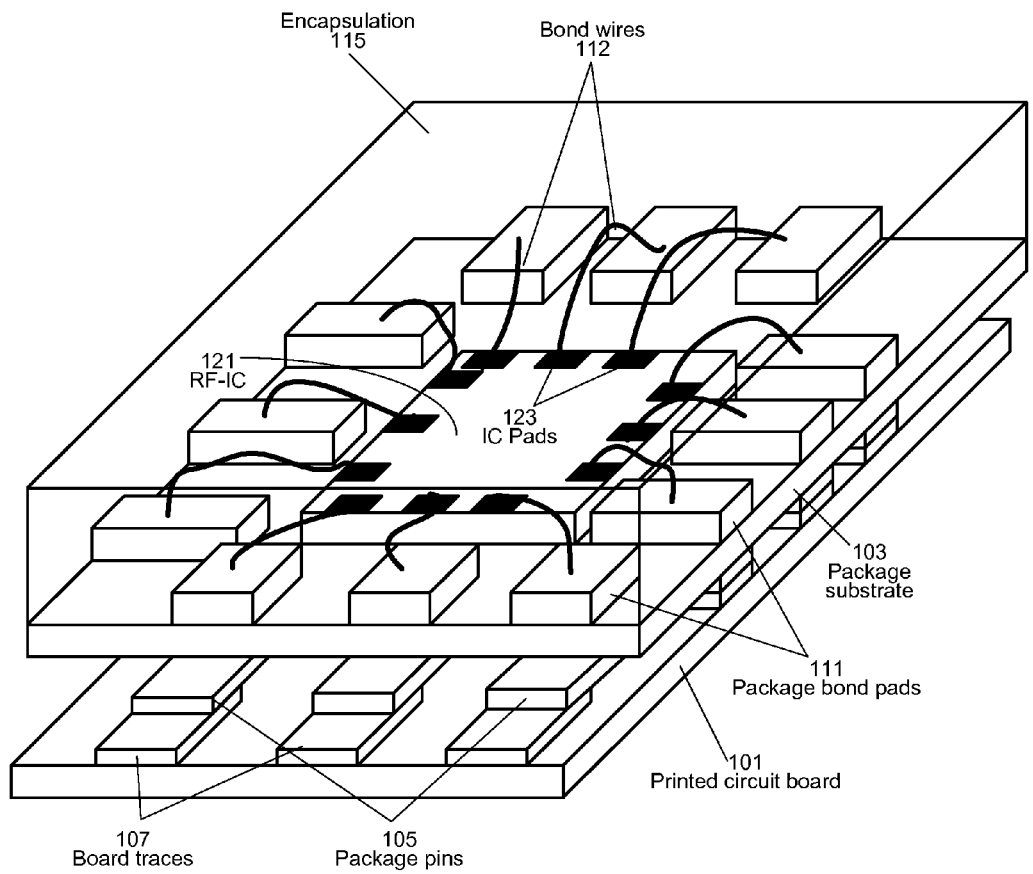
FIG. 1 illustrates a typical package used for microwave radiofrequency ICs.
Figure 2:
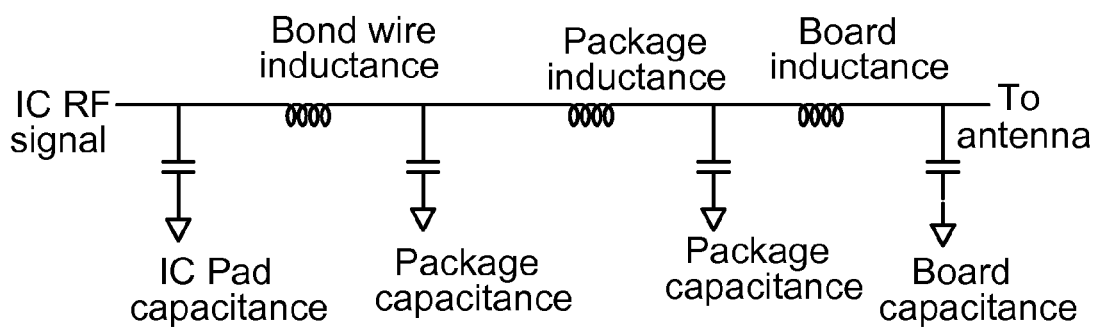
FIG. 2 shows a reasonable approximation for an equivalent circuit of a conventional radiofrequency IC lead for a signal passing from the chip to the package, especially an antenna connection.
Figure 6:
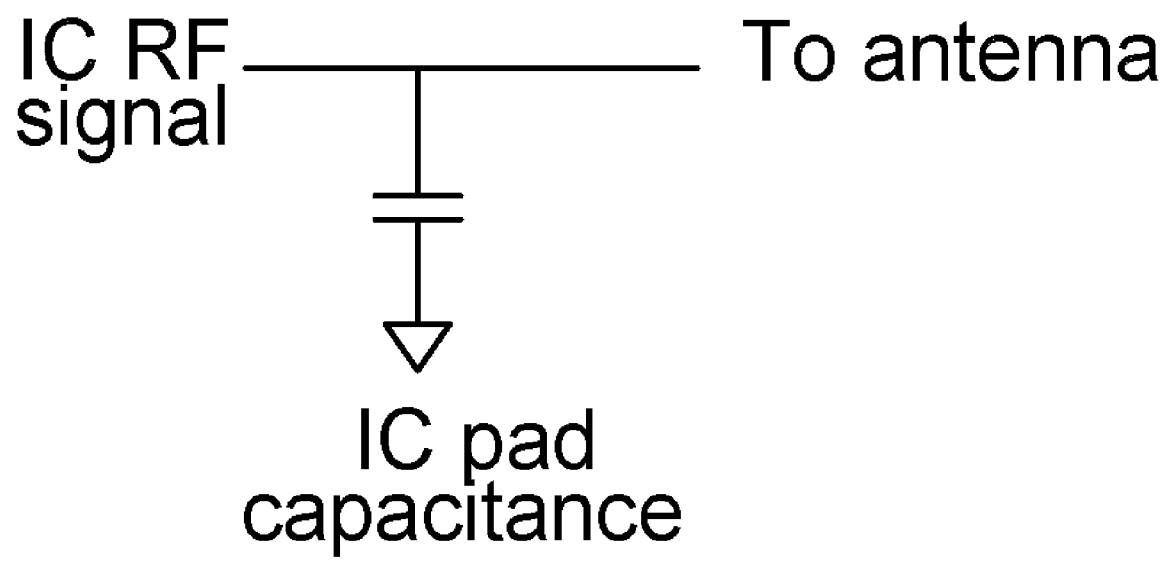
FIG. 6 shows a reasonable approximation of an equivalent circuit of the antenna lead shown in FIG. 5.

FIG. 6 shows a reasonable approximation of an equivalent circuit of the antenna lead 503, the bond wire to the IC bond pad 301 of FIG. 5. Unlike the case with conventional packaging (see FIG. 2), only the IC pad capacitance remains as a parasitic impedance.

One embodiment of the invention includes tuning out the some or all of the IC pad capacitance by appropriately sizing the severed antenna bond wire.

Another embodiment of the invention includes metallizing the top of the package in the vicinity of the exposed antenna wire bond 503—the bond wire to the IC bond pad 301 of FIG. 5. In this manner, a capacitively top loaded vertical may be constructed. In an improvement, this may be laser trimmed if necessary to tune the antenna.

RF systems that use multiple antennas are becoming common, e.g., for MIMO systems, for smart antenna systems, for including beam steering, for diversity, and so forth. Another aspect of the invention is constructing a package for a RF IC that includes multiple quarter wave verticals may be arrayed along the sides of the chip or chips, in order to form an antenna array. Radiation is in the normal direction, and away from the chip surface.

Arrays of antennas are important at mm-wave frequencies to allow technologies such as beam steering and/or MIMO to be implemented in a low cost manner. Arrays also may be used not only in communication applications in the tens to hundreds of GHz range, but also in TeraHertz imaging applications which are emerging as important in Homeland Security applications, mainly because TeraHertz radiation can image through clothing.

Note that in phase 2 (step 705), in one embodiment, the looping bond process operates according to present-day bonder operations. These operations start the bonding process on the IC pad 301 and finish on the package pin by compressing the wire and in so compressing the wire on the package pin, bonding and breaking the wire.

In an alternate embodiment, an alternate type of bonder is used that can provide a small flame to melt, or that can provide some other mechanism to otherwise cut the wire. For such a bonder that can cut the wire in mid-air, a loop is not required. A wire is bonded to the appropriate IC pad and placed vertically, then cut. Encapsulation and milling follows. Using such a method, there is no "dangling" connection to the package pin. Such an alternate method uses one less package pin.

Note that while one embodiment arranges the bond wire that will form the antenna to be approximately vertical, it will be clear that other directions also a are possible, In the context of this document, the term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

Reference throughout this specification to "one embodiment" or "an embodiment" means that a particular feature, structure or characteristic described in connection with the embodiment is included in at least one embodiment of the present invention. Thus, appearances of the phrases "in one embodiment" or wave "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified or clear from the context, the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All publications, patents, and patent applications cited herein are hereby incorporated by reference.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/ features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

I claim:

1. An integrated radio frequency device comprising:
    a substrate;
    a radio frequency integrated circuit on the substrate;
    a plurality of integrated circuit pads on the radio frequency integrated circuit, including an antenna connection pad;
    a monopole antenna made of bond wire connected at one end to the antenna connection pad and unconnected at the other end, the bond wire monopole antenna having an antenna length designed for operation at a frequency in the tens to hundreds of GHz range or at a TeraHertz imaging radiation frequency range, the bond wire monopole antenna extending out from the plane of the radio frequency integrated circuit;
    package bond pads one the substrate, at least some of package bond pads being connected to some of the plurality of integrated circuit pads by bond wires; and
    encapsulation covering one side of the substrate, including one side of the package bond pads, the radio frequency integrated circuit; the bond wires that connect some of the integrated circuit pads to some of the package bond pads, and the antenna, the encapsulation having a thickness from the substrate to the outside surface, the thickness such that the antenna has the antenna length and such that the monopole antenna's unconnected end reaches the outside surface of the encapsulation.

2. An integrated radio frequency device as recited in claim 1, wherein the monopole antenna is a quarter-wave monopole antenna.

3. An integrated radio frequency device as recited in claim 1, wherein the antenna length is designed for operation at a frequency in the mm-wave range.

4. An integrated radio frequency device as recited in claim 1, wherein the antenna length is designed for operation at a TeraHertz radiation frequency.

5. An integrated radio frequency device as recited in claim 1, wherein a plurality of the integrated circuit pads form respective antenna connection pads, and the integrated radio frequency device comprising:
    a plurality of monopole antennas each made of bond wire connected at one end to a respective antenna connection pad having the other end unconnected, each bond wire monopole antenna having an antenna length designed for operation at a frequency in the tens to hundreds of GHz range or at a TeraHertz imaging radiation frequency range, each bond wire monopole antenna extending out from the plane of the radio frequency integrated circuit.

6. An integrated radio frequency device as recited in claim 1, wherein the monopole antenna extends approximately vertically from the plane of the radio frequency integrated circuit.

7. An integrated radio frequency device as recited in claim 1, further comprising a metalized area on the outside surface the integrated circuit package in the vicinity of the monopole antenna's unconnected end.

8. An integrated radio frequency device as recited in claim 5, wherein the metalized area is selected to form a capacitance such that the monopole antenna is tuned to a desired frequency.

* * * * *

UNITED STATES PATENT AND TRADEMARK OFFICE
CERTIFICATE OF CORRECTION

PATENT NO. : 7,586,193 B2
APPLICATION NO. : 11/539112
DATED : September 8, 2009
INVENTOR(S) : Weste Page 1 of 1

It is certified that error appears in the above-identified patent and that said Letters Patent is hereby corrected as shown below:

In column 4, line 58, kindly delete the word "wave"

Signed and Sealed this

Third Day of November, 2009

David J. Kappos
*Director of the United States Patent and Trademark Office*